United States Patent [19]
Grabmaier et al.

[11] 4,330,524
[45] May 18, 1982

[54] CRYSTALLINE $Bi_2Ge_3O_9$ AND ITS PREPARATION

[75] Inventors: Christa Grabmaier, Berg; Siegfried Haussüehl, Cologne, both of Fed. Rep. of Germany

[73] Assignee: Siemens Aktiengesellschaft, Berlin & Munich, Fed. Rep. of Germany

[21] Appl. No.: 105,947

[22] Filed: Dec. 20, 1979

[30] Foreign Application Priority Data

Jan. 17, 1979 [DE] Fed. Rep. of Germany ....... 2901669

[51] Int. Cl.³ .................... C01G 17/00; C01G 29/00
[52] U.S. Cl. .............................. 423/593; 156/617 SP; 156/DIG. 67; 156/DIG. 79; 250/492.1
[58] Field of Search ............... 423/593; 156/617 SP, 156/DIG. 67, DIG. 79

[56] References Cited

U.S. PATENT DOCUMENTS 4,092,208  5/1978  Chadwick et al. ................... 423/600

FOREIGN PATENT DOCUMENTS 2390401  1/1979  France ................................ 423/593
49-95900  9/1974  Japan ................................. 423/593
52-18500  2/1977  Japan ................................. 423/593

OTHER PUBLICATIONS

Grabmaier et al., "Zeit fur Krislallographic", vol. 149, 1979, pp. 261–267.
Speranskaya et al., "Russian Journal of Inorganic Chemistry", vol. 9, 1964, pp. 226–231.
Levin et al., "Journal of Research, NBS", vol. 68A, 1964, pp. 197–206.

*Primary Examiner*—Herbert T. Carter
*Attorney, Agent, or Firm*—Hill, Van Santen, Steadman, Chiara & Simpson

[57] ABSTRACT

A monocrystalline $Bi_2Ge_3O_9$ is formed, for example, via the Czochralski technique from a melt containing pure $Bi_2O_3$ and $GeO_2$ at a molecular ratio of 1:3. This crystal is useful as an x-ray spectrometer crystal and/or as a light defector crystal in conjunction with an ultrasonic deflection field properly applied to such crystals.

2 Claims, 3 Drawing Figures

CRYSTALLINE $Bi_2Ge_3O_9$ AND ITS PREPARATION

BACKGROUND OF THE INVENTION

1. Field of the Invention

The invention relates to bismuth-germanium-oxide materials and somewhat more particularly to such a material with the formula $Bi_2Ge_3O_9$ in crystalline form useful in various devices, such as an x-ray spectrometer crystal or as a photo-acoustic deflector crystal.

2. Prior Art

*Russian Journal of Inorganic Chemistry*, Vol. 9, No. 2, pages 226–230 (1964) describes the bismuth oxide-germanium-dioxide system and indicates that the phase diagram of $Bi_2O-GeO_2$ has stable compounds only for two mixture ratios, namely, at $Bi_2O_3:GeO_2$ ratio of 2:3 and at $Bi_2O_3:GeO_2$ ratio of 7:1.

*Journal of Research of the National Bureau of Standards-A. Physics and Chemistry*, Vol. 68A, No. 2, pages 197–206 (1964) corrects the $Bi_2O_3:GeO_2$ ratio from 7:1 to 6:1. As to a $Bi_2O_3:GeO_2$ ratio of 1:3, which is relevant to the invention, the prior art established that at such a ratio, only eutectic materials exist. Eutectic materials of this type are inevitably multiphased so that monocrystalline structures from eutectic materials are not possible.

SUMMARY OF THE INVENTION

The invention provides a new crystalline material which has not previously been produced or available to the art in any manner. This new crystalline material is technically useful for solving new technical problems or at least providing fundamental improvements to known technical solutions. One such new material consists of a bismuth-germanium-oxide material having an overall formula $Bi_2Ge_3O_9$ and occurring as a stable single-phase chemical compound existing in crystalline and monocrystalline form.

A process for producing such new crystalline material comprises establishing a melt composed of relatively pure $Bi_2O_3$ and $GeO_2$ at a ratio of 1:3, contacting such melt with a seed crystal and controllably drawing or pulling the seed crystal from the melt so that a monocrystal forms thereon, in accordance with the Czochralski technique.

The $Bi_2Ge_3O_9$ crystals of the invention are useful as x-ray spectrometer crystals or as light deflectors when an ultrasonic deflection field, which forms an optical lattice, is established in such crystals.

DESCRIPTION OF PREFERRED EMBODIMENTS

Figure 1:
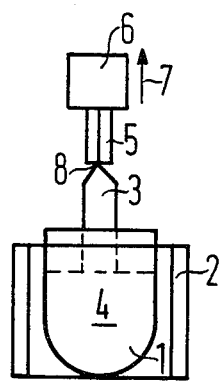
FIG. 1 is an elevated schematic view of an apparatus useful for producing $Bi_2Ge_3O_9$ monocrystals of the invention.

In direct contrast to prior art teachings relative to bismuth oxide-germanium oxide systems, the invention provides a totally unexpected genuine chemical compound producible in crystalline and monocrystalline form.

The chemical compound and/or monocrystal of the invention exhibits particularly favorable characteristic values for use in x-ray spectrometry, preferably with soft x-rays and for use in technical procedures based on photo-acoustic effects.

The inventive crystals are produced via a crystal drawing process from a suitable melt contained in a crucible, which is fundamentally known per se.

In such crystal production process, which corresponds to the so-called Czochralski technique, very pure bismuth trioxide (99.995% pure) and very pure germainum dioxide (99.999% pure) are admixed in a molecular $Bi_2O_3:GeO_2$ ratio of 1:3, positioned in, for example, a platinum crucible having, for example, a diameter of 40 mm and a height of 40 mm and are heated to about 1275° K. so as to form a uniform melt. A seed crystal is controllably brought into contact with this melt and rotated, in an oxygen or air atmosphere so as to avoid reduction of the molten oxides and slowly withdrawn from the melt, which is maintained at about 1263° to 1273° K. so that a monocrystal forms on the seed. The so-formed monocrystal has a composition precisely corresponding to the composition of the melt.

As exemplary process parameters, a seed crystal rotation of 100 revolutions per minute and a crystal drawing rate of 5 mm per hour produces monocrystals of the invention having a length of 50 mm and a diameter of 15 mm which are entirely free of occlusions or other defects. If too high of a drawing speed is utilized, microscopic occlusions of platinum and gas bubbles occur in the formed crystals and are thus to be avoided.

A $Bi_2Ge_3O_9$ monocrystal of the invention is useful as an x-ray spectrometer crystal. As will be appreciated, a multi-phase eutectic material mixture could not be utilized as a spectrometer crystal. A number of spectrometer crystals are known and are used in various systems. For example, potassium hydrogen phthalate with a double lattice spacing (2d) of 26.632Å is known, as are thallium hydrogen phthalate with a 2d spacing of 25.900Å, α-quartz with a 2d-spacing of 2.749Å and topaz with a 2d-spacing of 2.712Å. The monocrystals of the invention have a 2d lattice spacing (corresponding to $2a_2$) of 19.572Å for the [001]-direction, i.e., parallel to the six-number axis system. Particularly for use with average to soft x-rays, crystals of the invention are substantially superior to α-quartz and/or topaz crystals because of its higher coefficient of diffusion. In comparison to known phthalate crystals, monocrystals of the invention have extremely important advantageous properties, namely they are water insoluble, exhibit high chemical stability and extremely high mechanical stability. In comparison to all known spectrometer crystals, the $Bi_2Ge_3O_9$ crystals of the invention, in the [001] direction, have an extremely low thermal coefficient of expansion, which renders superfluous thermostabilization of the spectrometer crystal over a wide temperature range. The crystals of the invention also exhbit a very desirably high absorption coefficient for x-rays.

Monocrystals of the invention can be split extremely easily, for example in comparison to mica, at right angles to the [001] direction, i.e., parallel to the (001) plane. This results in a considerable reduction in production costs of finely processed $Bi_2Ge_3O_9$ monocrystals of the invention. It must be remembered that natural split surfaces of crystals generally have better optical qualities than crystal surfaces artificially produced, even with high outlays, as by sawing, grinding, lapping or polishing.

When a $Bi_2Ge_3O_9$ crystal of the invention is used to diffract light in a Debye ultrasonic field, a high degree of diffraction, i.e., beam deflection, can be achieved because of the very pronounced photo-elastic effect of this crystalline material. The inventive crystals of the invention have only a very limited self-absorption over the wave length range extending from about 0.290 μm to a few μm. Consequently, crystals of the invention, because of this property are useful in systems using laser radiation.

For example, lead molybdate presently used in a laser high speed printer system, known per se, can be advantageously replaced with a crystal of the invention. In a printer system of this type, the crystal functions to deflect the laser beam used for printing to its proper position at extremely high rates of speed.

Referring now to FIG. 1, a platinum crucible 1 is positioned in an operable heating means 2 capable of controllably heating the crucible and its contents to about 1300° K. A measured amount of pure $Bi_2O_3$ (99.995% pure) and pure $GeO_2$ (99.999% pure) so as to provided a $Bi_2O_3:GeO_2$ ratio of 1:3 is placed in the energized crucible so as to form a melt 4. A seed crystal 8 is mounted at the end of a rotatable shaft 5 which is driven by rotating means 6. The shaft is lowered into contact with the melt and slowly withdrawn at a given longitudinal rate in the direction 7 while rotating so that a monocrystal 3 composed of $Bi_2Ge_3O_9$ is drawn out of the melt, as shown. The crystal 3 rotates together with the shaft 5 and the seed crystal 8.

Figure 2:
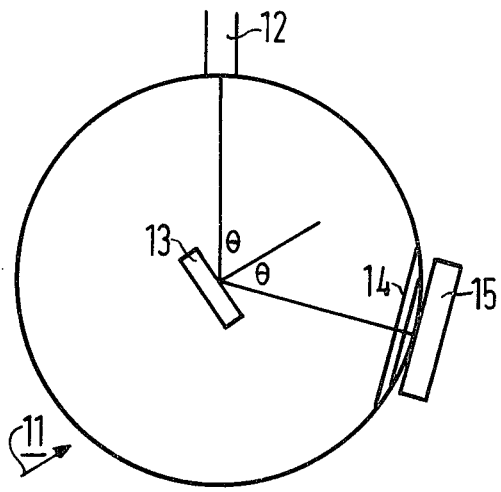
FIG. 2 is a plan schematic view of an x-ray goniometer system utilizing a $Bi_2Ge_3O_9$ monocrystal as an x-ray spectrometer crystal in accordance with the principles of the invention.

FIG. 2 illustrates an exemplary x-ray spectrometer means, such as an operative x-ray goniometer system 11, operative principles and details of which are known, for example, see German Offenlegungsschrift No. 26 37 945. Essentially, such a system comprises an operative x-ray source 12, a wafer-like $Bi_2Ge_3O_9$ monocrystal 13 of the invention and a detector suspender 15, which is provided with a slit diaphragm 14. The crystal 13 is positioned in a suitable support (not shown) in which the crystal can be selectively rotated or adjusted about an axis which is at right angles to the plane of FIG. 2 in angular positions $\theta$, relative to the x-ray source 12. As is conventional in a goniometer, the detector 15 is moved into an angular position $2\theta$. The crystal 13 functions as an x-ray spectrometer crystal in this and similar devices.

Figure 3:
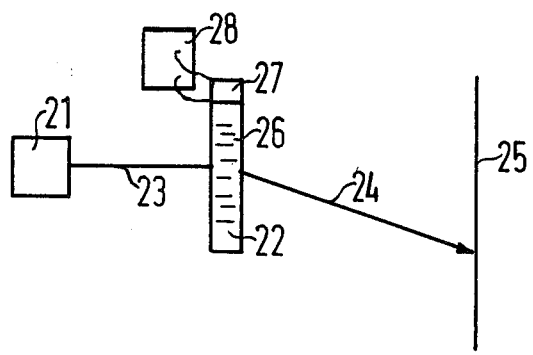
FIG. 3 is an elevated schematic view of a light deflector system utilizing a $Bi_2Ge_3O_9$ monocrystal based on the Debye-Sears effect.

FIG. 3 illustrates an exemplary light deflector system wherein a $Bi_2Ge_3O_9$ monocrystal of the invention is utilized as a light deflector functioning in accordance with the Debye-Sears effect. A light radiation or beam 23, which may be a laser beam, emerges from a light source 21 and impinges on crystal 22. Within the crystal 22, the beam is diffracted by a vertical ultrasonic wave field 26 and emerges as beam 24 extending at an angle to the original beam 23. The beam 24, which is deflectable in a controlled manner can be used, for example, to print a photo-sensitive paper 25. The ultrasonic wave field 26 can be produced, for example, via a piezo-electric body 26 applied onto the crystal 22. A generator means 28 is operationally coupled to the piezo body 27 so that a controllable voltage is fed to the body 27 so as to produce a controllably variable electric field, which, because of the piezo effect, causes corresponding mechanical contractions and expansions in the piezo-body 27. These movements in body 27 are transferred to crystal 22 wherein, when the size dimensions are appropriate, they produce a vertical (in the embodiment shown) ultrasonic wave field which acts as an optical lattice.

As is apparent from the foregoing specification, the present invention is susceptible of being embodied with various alterations and modifications which may differ particularly from those that have been described in the preceding specification and description. For this reason, it is to be fully understood that all of the foregoing is intended to be merely illustrative and is not to be construed or interpreted as being restrictive or otherwise limiting of the present invention, excepting as it is set forth and defined in the hereto-appended claims.

We claim as our invention:

1. In a bismuth-germanium oxide material having an emperical formula $Bi_2 Ge_3 O_9$, the improvement comprising wherein said material is a single-phase chemical compound in monocrystalline form and exhibits a double lattice spacing, 2d, of 10.572Å in the [001]-crystal direction.

2. A method of producing the monocrystalline compound defined in claim 1 comprising providing a melt containing pure $Bi_2 O_3$ and $Ge O_2$ in a molecular ratio, like in the monocrystalline compound, of 1:3 and drawing a monocrystal therefrom via the Czochralski technique.

* * * * *